US011558971B2

(12) United States Patent
Chen et al.

(10) Patent No.: US 11,558,971 B2
(45) Date of Patent: Jan. 17, 2023

(54) LOCK MECHANISM FOR A FLAP

(71) Applicant: Quanta Computer Inc., Taoyuan (TW)

(72) Inventors: Chao-Jung Chen, Taoyuan (TW); Hou-Hsien Chang, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 216 days.

(21) Appl. No.: 17/123,985

(22) Filed: Dec. 16, 2020

(65) Prior Publication Data

US 2022/0104372 A1  Mar. 31, 2022

Related U.S. Application Data

(60) Provisional application No. 63/083,446, filed on Sep. 25, 2020.

(51) Int. Cl.
*H05K 5/02* (2006.01)
*H05K 7/14* (2006.01)
*F16H 19/04* (2006.01)
*E05C 3/12* (2006.01)

(52) U.S. Cl.
CPC .......... *H05K 5/0221* (2013.01); *F16H 19/04* (2013.01); *H05K 7/1488* (2013.01); *E05C 3/12* (2013.01); *E05Y 2201/47* (2013.01); *E05Y 2201/716* (2013.01); *E05Y 2201/722* (2013.01); *E05Y 2900/606* (2013.01)

(58) Field of Classification Search
CPC ........................................................ G06F 1/20
See application file for complete search history.

(56) References Cited

U.S. PATENT DOCUMENTS

2020/0323106 A1*  10/2020  Peng .................. H05K 7/20145
2021/0045261 A1*  2/2021  Huang ................ H05K 7/1489

* cited by examiner

*Primary Examiner* — Jerry Wu
(74) *Attorney, Agent, or Firm* — Nixon Peabody LLP

(57) ABSTRACT

A lock mechanism within a slot of a computer chassis is disclosed. The lock mechanism includes a gear wheel, a gear rack body, a push rod latch, a push rod body, and a chassis latch. The gear wheel, the gear rack body, the push rod latch, the push rod body, and the chassis latch cooperate to restrict a flap in the slot from opening when the flap is in the closed position, and the chassis latch is engaged with a cutout on the push rod body.

20 Claims, 18 Drawing Sheets

LOCK MECHANISM FOR A FLAP

CROSS-REFERENCE TO RELATED APPLICATION

This application claims priority under 35 U.S.C. § 119 to U.S. Provisional Application No. 63/083,446, titled "AUTO-LOCK CONTROL DEVICE," and filed on Sep. 25, 2020. The contents of that application are hereby incorporated by reference in their entirety.

FIELD OF THE INVENTION

The present invention relates to a mechanism that locks a flap within a slot of a chassis, such as a computer chassis.

BACKGROUND

Computer chassis often have one or more slots that allow for the insertion and removal of a sled retaining a computer component. For example, servers—such as blade servers or similarly configured servers—include a chassis with one or more slots that allow for the insertion and removal of sleds, such as blade server sleds. The slots often have flaps. In a closed position, the flaps can restrict or reduce airflow from escaping or entering the chassis through the slot. The flaps can open upon inserting sleds within the slots. For example, the action of inserting a sled within a slot can cause the flap to move from a closed flap position to an open flap position, which allows the sled to be fully inserted into the chassis with the slot, or allows the module to receive airflow from within the chassis.

However, issues can arise when the sled is withdrawn from the slot. Specifically, the flap of a slot may not remain closed based on the air pressure differential within the slot. This can result in unwanted airflow entering or escaping the slot from the flap opening.

Accordingly, there is a need for mechanisms that can assist in having a flap remain closed upon the withdrawal of a sled from a slot. Aspects of the present disclosure solve this and other problems.

SUMMARY

According to one embodiment, a lock mechanism within a slot of a computer chassis is disclosed. The lock mechanism includes a gear wheel coupled to a flap within the slot. The flap is configured to restrict airflow through the slot. The lock mechanism further includes a gear rack body meshed with the gear wheel and configured to translate within the slot. The gear rack body has a gear rack projection. The lock mechanism further includes a push rod latch configured to translate within the slot. The push rod latch includes a push rod latch projection aligned to abut against the gear rack projection. The lock mechanism further includes a push rod body configured to translate within the slot and abut against the flap for rotating the flap between a closed position and an open position. The push rod body further includes a cutout at a first end. The lock mechanism further includes a chassis latch configured to engage the cutout of the push rod body. The gear wheel, the gear rack body, the push rod latch, the push rod body, and the chassis latch cooperate to restrict the flap from opening when the flap is in the closed position, and the chassis latch is engaged with the cutout.

Aspects of the embodiment include the lock mechanism having a spring connected to the push rod latch and the push rod body. Aspects of the embodiment include a first end of the spring being connected to the push rod body and a second end of the spring being connected to the push rod latch. Aspects of the embodiment include the push rod body partially sitting on the push rod latch, with the push rod latch partially inserted into the push rod body. Aspects of the embodiment include the push rod body being configured to translate relative to the push rod latch in a first direction and translate with the push rod latch in a second direction. Aspects of the embodiment include the gear rack projection being positioned on a side edge near a leading end of the gear rack body. Aspects of the embodiment include the chassis latch being configured to be depressed and disengaged from the cutout, to release the push rod body for translating within the slot. Aspects of the embodiment include the chassis latch including at least one tooth that engages the cutout. Aspects of the embodiment include the gear wheel and the flap sharing a common axis of rotation. Aspects of the embodiment include the push rod body including a notch in a leading edge.

According to another embodiment, a computer system is disclosed. The computer system includes a sled configured to retain a computer component. The computer system further includes a chassis having a slot configured to accept the sled as the sled translates into the chassis. The computer system further includes a flap configured to restrict airflow through the slot in a closed position and allow airflow through the slot in an open position. The computer system further includes a lock mechanism in the slot. The lock mechanism includes a gear wheel coupled to the flap. The lock mechanism further includes a gear rack body meshed with the gear wheel and configured to translate within the slot. The gear rack body has a gear rack projection. The lock mechanism further includes a push rod latch configured to translate within the slot. The push rod latch includes a push rod latch projection aligned to abut against the gear rack projection. The lock mechanism further includes a push rod body configured to translate within the slot and abut against the flap for rotating the flap between the closed position and the open position. The push rod body includes a cutout at a first end. The lock mechanism further includes a chassis latch configured to engage the cutout of the push rod body when the sled is not inserted into the slot. With the flap in the closed position, the chassis latch is configured to be engaged with the cutout. Further, the push rod latch projection abuts against the gear rack projection to prevent the gear wheel, through the gear rack body, from rotating. This arrangement locks the flap in the closed position.

Aspects of the embodiment include the computer system having a spring connected to the push rod latch and the push rod body. Aspects of the embodiment include a first end of the spring being connected to the push rod body and a second end of the spring being connected to the push rod latch. Aspects of the embodiment include, with the flap in the closed position, tension building in the spring as the push rod body further translates towards a leading end of the slot under action of the sled latch in response to the sled being withdrawn from the slot. Aspects of the embodiment include the tension in the spring being configured to return the push rod body to a locked position upon the sled latch disengaging from the cutout of the push rod body, with the fan in the closed position. Aspects of the embodiment include the push rod body being configured to translate relative to the push rod latch in a first direction and translate with the push rod latch in a second direction. Aspects of the embodiment include the sled body being configured to depress the chassis latch when the sled body is inserted into the slot, which disengages the chassis latch from the cutout of the push rod body. Aspects of the embodiment include the sled having a sled latch connected to the sled body and configured to engage the cutout of the push rod body and withdraw the push rod body from actuating the flap open upon removal of the sled from the slot. Aspects of the embodiment include the computer system having a chassis projection on the chassis configured to cause the sled latch to engage and disengage from the cutout of the push rod body as the sled latch rides over the projection when the sled is inserted and withdrawn from the slot, respectively. Aspects of the embodiment include the cutout of the push rod body having a notch that allows a leading edge of the push rod body to translate beyond the chassis projection.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims.

BRIEF DESCRIPTION OF THE DRAWINGS

The disclosure, and its advantages and drawings, will be better understood from the following description of embodiments together with reference to the accompanying drawings. These drawings depict only embodiments and are, therefore, not to be considered as limitations on the scope of the various embodiments or claims.

DETAILED DESCRIPTION

Figure 1:
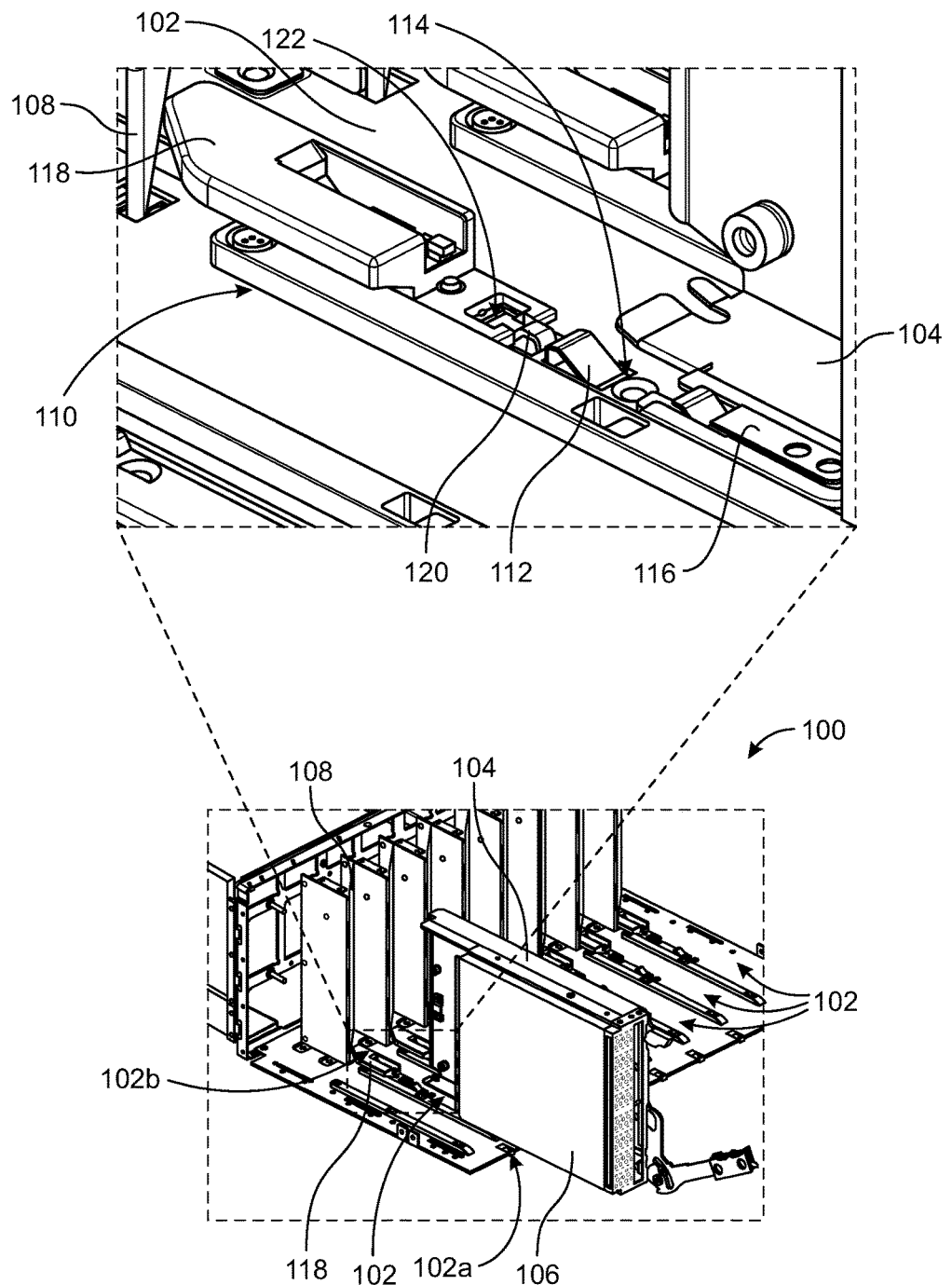
FIG. 1 is a perspective view depicting a step of inserting a sled into a slot of a chassis, according to aspects of the present disclosure.

The various embodiments are described with reference to the attached figures, where like reference numerals are used throughout the figures to designate similar or equivalent elements. The figures are not drawn to scale, and they are provided merely to illustrate the instant invention. It should be understood that numerous specific details, relationships, and methods are set forth to provide a full understanding. One having ordinary skill in the relevant art, however, will readily recognize that the various embodiments can be practiced without one or more of the specific details, or with other methods. In other instances, well-known structures or operations are not shown in detail to avoid obscuring certain aspects of the various embodiments. The various embodiments are not limited by the illustrated ordering of acts or events, as some acts may occur in different orders and/or concurrently with other acts or events. Furthermore, not all illustrated acts or events are required to implement a methodology in accordance with the present invention.

Elements and limitations that are disclosed, for example, in the Abstract, Summary, and Detailed Description sections, but not explicitly set forth in the claims, should not be incorporated into the claims, singly, or collectively, by implication, inference, or otherwise. For purposes of the present detailed description, unless specifically disclaimed, the singular includes the plural and vice versa. The word "including" means "including without limitation." Moreover, words of approximation, such as "about," "almost," "substantially," "approximately," and the like, can be used herein to mean "at," "near," or "nearly at," or "within 3-5% of," or "within acceptable manufacturing tolerances," or any logical combination thereof, for example.

With regards to the present disclosure, the terms "computing device" or "computing system" or "computer system" or "computer" refer to any electronically-powered or battery-powered equipment that has hardware, software, and/or firmware components, where the software and/or firmware components can be configured for operating features on the device.

Referring to FIG. 1, illustrated is a perspective view depicting a chassis 100 of a computer system with a slot 102 receiving a sled 104, according to aspects of the present disclosure. The chassis 100 includes a plurality of slots 102. However, the chassis 100 can instead have one slot 102 or more than one slot 102, such as two slots, three slots, four slots, five slots, etc. The slot 102 is configured to receive the sled 104 from a leading end 102*a* of the slot 102, i.e., opposite from the flap end 102b of the slot 102. As used herein, the phrase "leading end" or "leading edge" refers to an end or an edge, respectively, of a corresponding element that is closer to the leading end 102a of the slot 102 for the element. Similarly, as used here, the phrase "trailing end" or "trailing edge" refers to an end or an edge, respectively, of a corresponding element that is closer to the flap end 102b of the slot 102 for the element.

The sled 104 is configured to hold a computer component 106. The computer component 106 can be any type of computer component that can be inserted and removed from the chassis 100, such as a memory component, a storage component, a processing component, etc.

The slot 102 has a flap 108 that restricts airflow through the slot 102. For example, when the sled 104 is not retained within the slot 102, the flap 108 is closed and restricts airflow from passing through the slot 102. When the sled 104 is retained within the slot 102, the flap 108 is open to allow airflow to pass through the slot 102 and, for example, cool the computer component 106 retained by the sled 104.

As shown in the detailed portion of FIG. 1, the slot 102 further includes a lock mechanism 110. The lock mechanism 110 assists in maintaining the flap 108 in an open and closed position, as well as opening and closing of the flap 108 with the insertion and removal of the sled 104. The lock mechanism 110 includes a push rod body 118. The push rod body 118 is configured to translate within the slot 102 and abut against the flap 108 for opening the flap 108 when the sled 104 is inserted into the slot 102. The push rod body 118 further maintains the flap 108 in an open position with the sled 104 is inserted into the slot 102.

The lock mechanism 110 also includes a chassis latch 112 that extends up and through an aperture 114 in the chassis 100, or at least a panel of the chassis 100 that partially defines the slot 102. As discussed further below, as the sled 104 is inserted into the slot 102, the sled 104 rides over and pushes down the chassis latch 112. The chassis latch 112 pushed down releases the push rod body 118. As the sled 104 is further inserted into the slot 102, a sled latch 116 contacts and rides over a projection 120 on the chassis 100.

Figure 2:
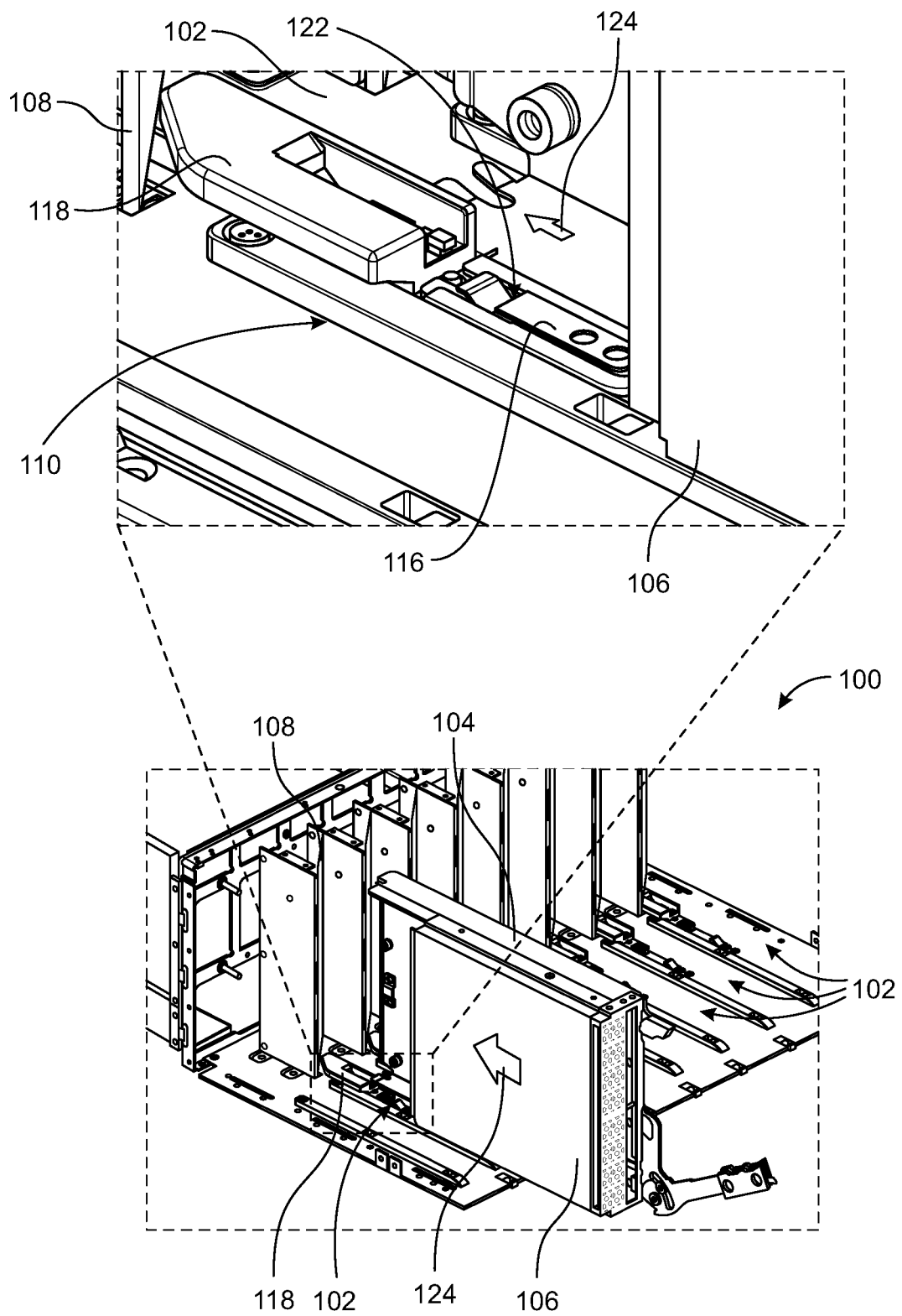
FIG. 2 is a perspective view depicting another step of inserting a sled into a slot of a chassis, according to aspects of the present disclosure.

Referring to FIG. 2, after the sled latch 116 rides over the projection 120 (FIG. 1), the sled latch 116 engages the cutout 122 of the push rod body 118, as shown in the detailed portion. The sled latch 116 engaged with the cutout 122 of the push rod body 118 engages the sled 104 with the push rod body 118. Thereafter, translation of the sled 104 in the slot 102 (e.g., in the direction of the arrow 124) causes the push rod body 118 to translate in the same direction. Translation of the sled 104 can be transferred to the push rod body 118 through the sled latch 116, the sled 104 directly, or both.

Figure 3:
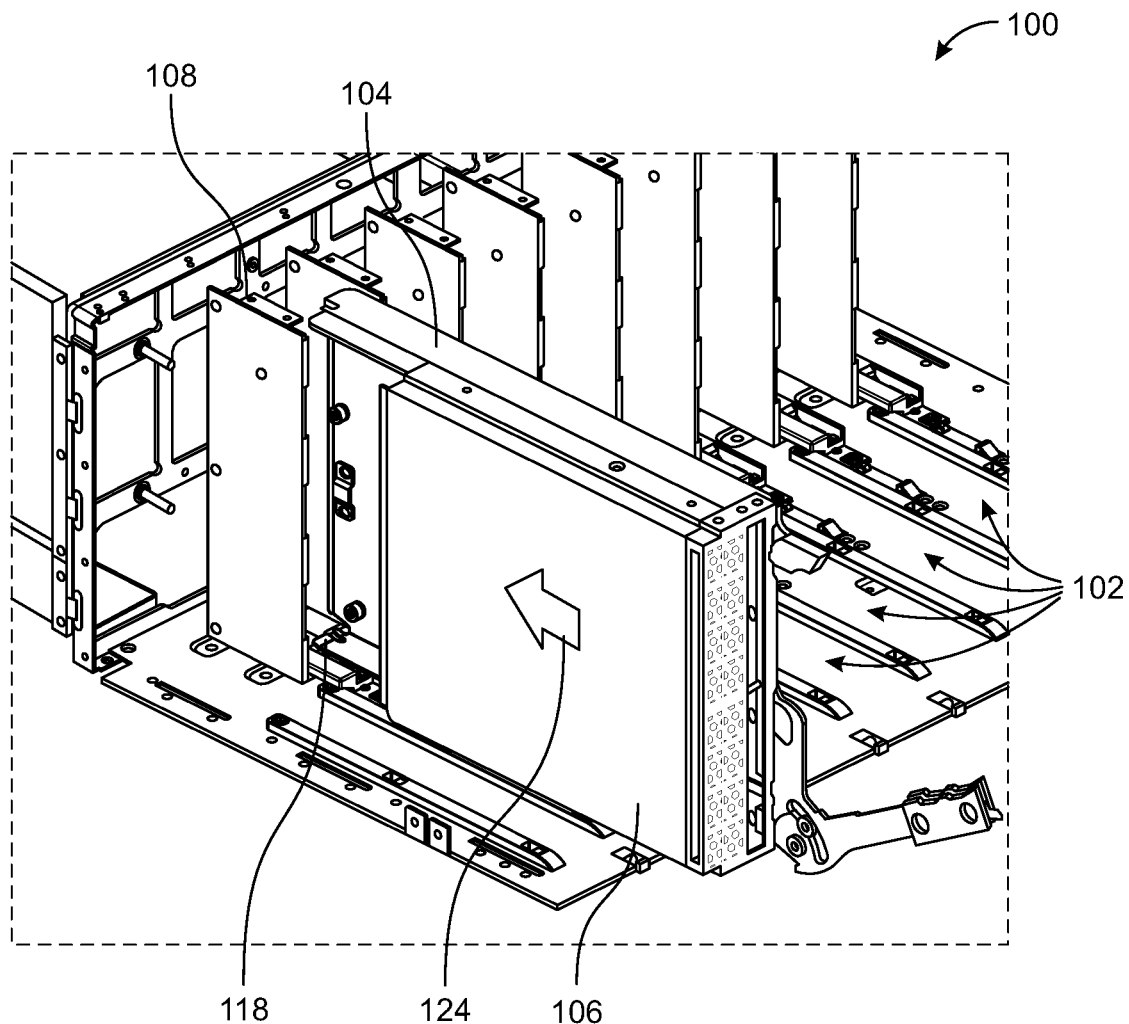
FIG. 3 is a perspective view depicting another step of inserting a sled into a slot of a chassis, according to aspects of the present disclosure.

Referring to FIG. 3, as the sled 104 is further inserted into the slot 102 in the direction of arrow 124, the push rod body 118 causes the flap 108 to fully open. Further, with the sled 104 fully inserted into the slot 102, the push rod body 118 maintains the flap 108 fully open.

Figure 4:
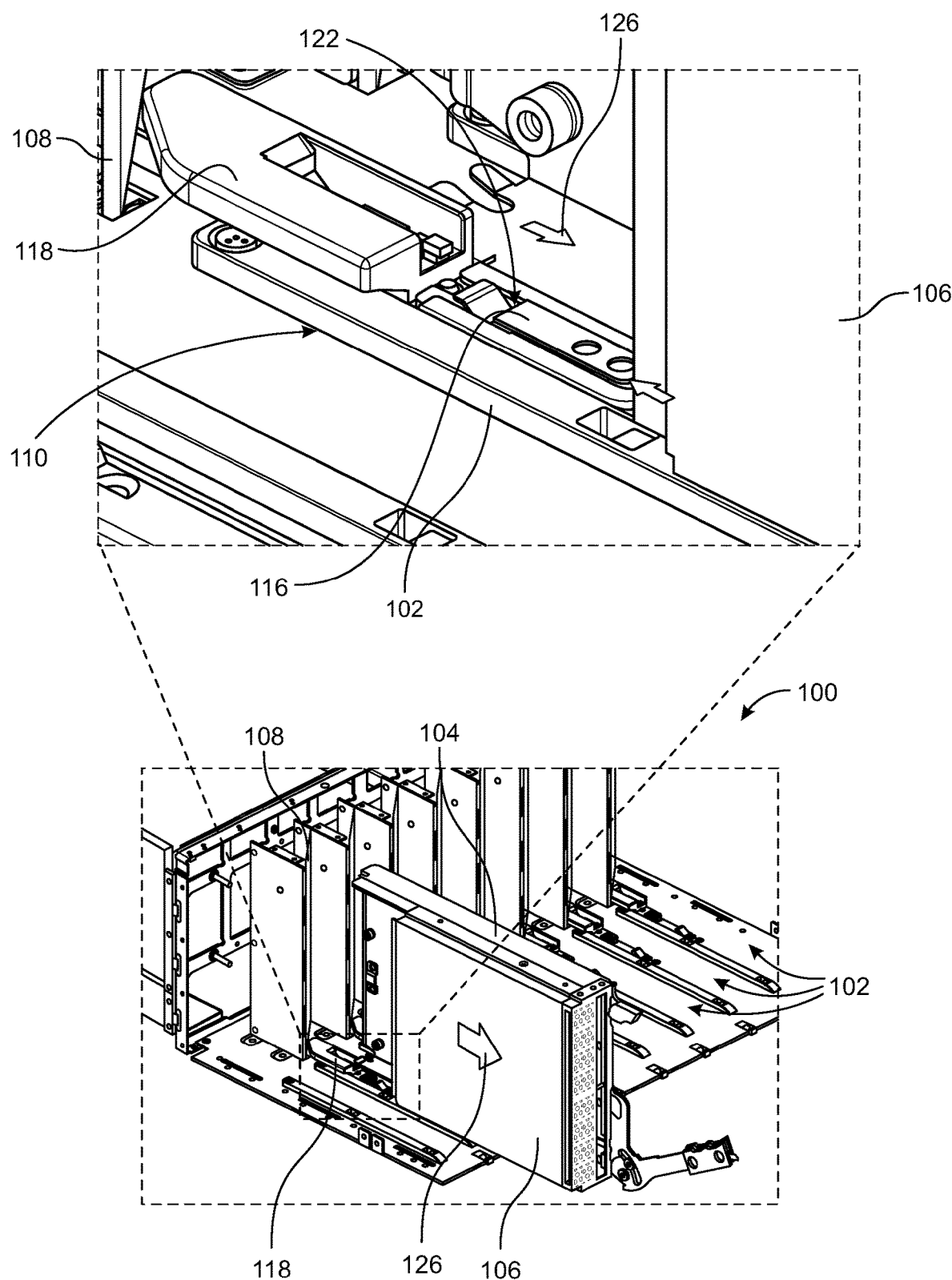
FIG. 4 is a perspective view depicting a step of withdrawing a sled from a slot of a chassis, according to aspects of the present disclosure.

Referring to FIG. 4, as the sled 104 is removed from the slot 102 (e.g., in the direction of the arrow 126), the sled latch 116 engaged with the cutout 122 of the push rod body 118 (as shown in the detailed portion) causes the push rod body 118 to be withdrawn away from the flap 108 in the same direction. This allows the flap 108 to actuate back to a closed position.

Figure 5:
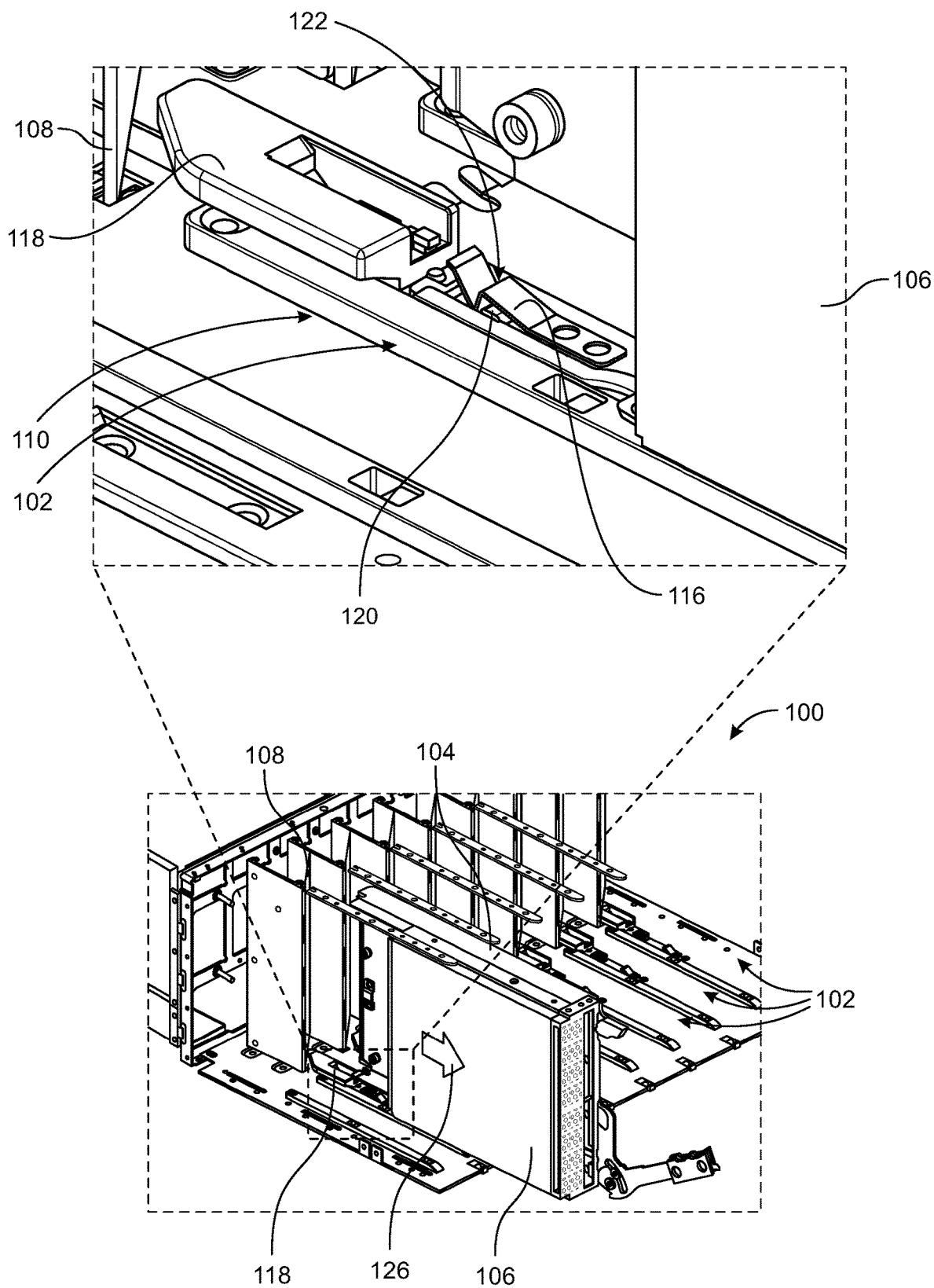
FIG. 5 is a perspective view depicting another step of withdrawing a sled from a slot of a chassis, according to aspects of the present disclosure.
Figure 7A:
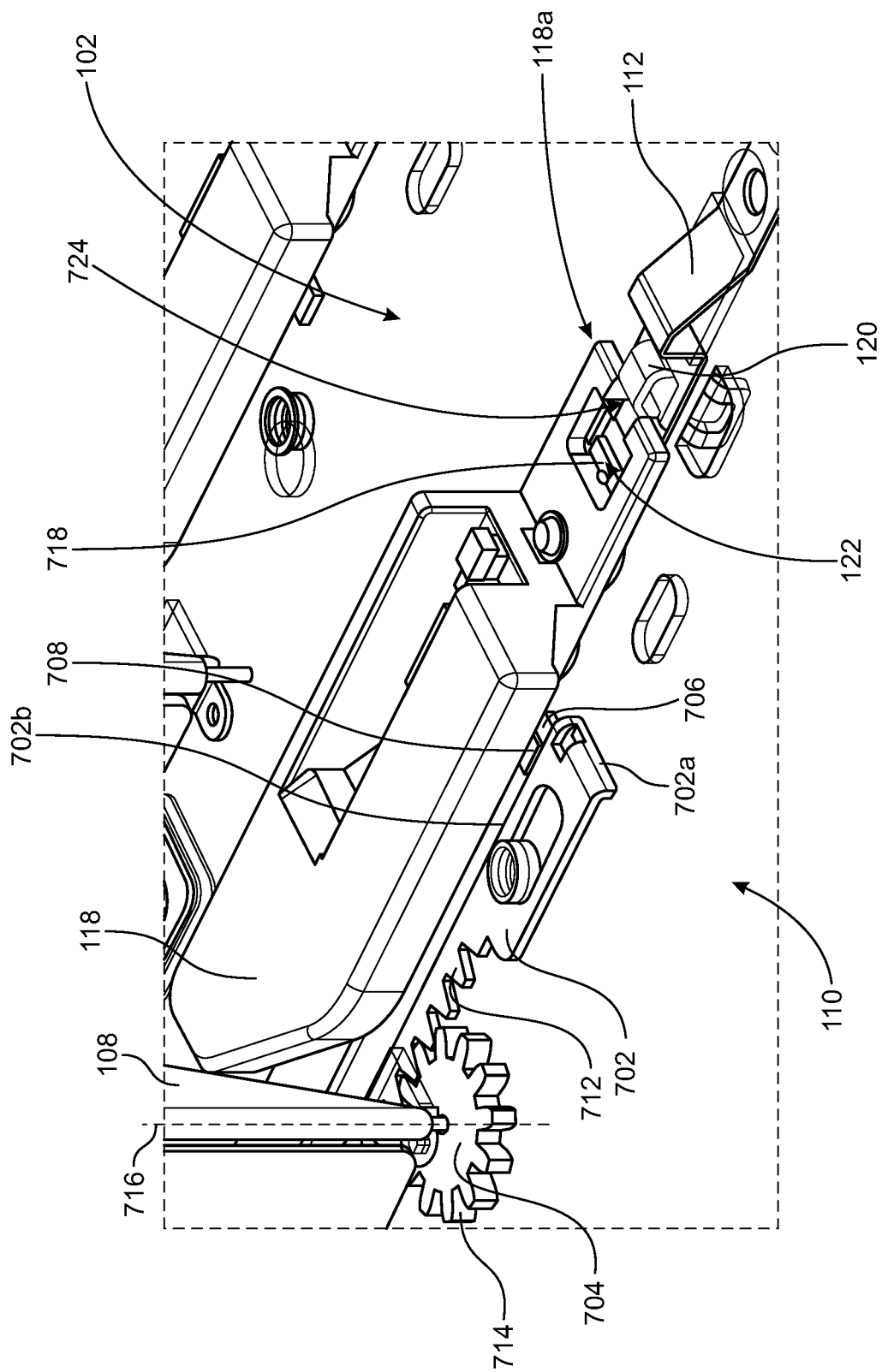
FIG. 7A is a top perspective view depicting a lock mechanism, according to aspects of the present disclosure.
Figure 7B:
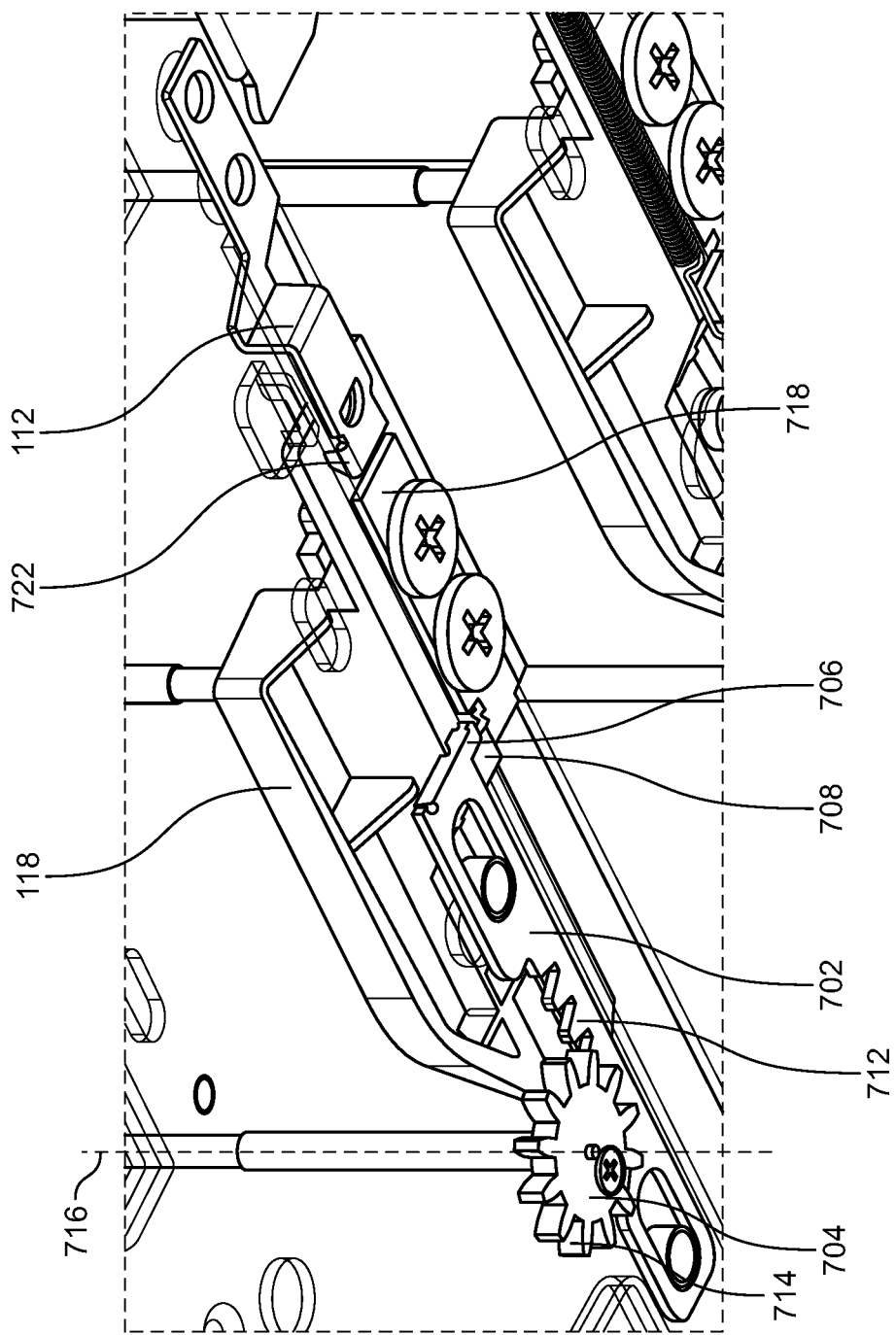
FIG. 7B is a bottom perspective view depicting a lock mechanism, according to aspects of the present disclosure.

Referring to FIG. 5, as the sled 104 is further removed from the slot 102 (e.g., in the direction of the arrow 126), the sled latch 116 engages and rides over the projection 120, as shown in the detailed portion and as described further below (FIGS. 7A-7B). This causes the sled latch 116 to disengage from the cutout 122 of the push rod body 118, which causes the sled latch 116 to release the push rod body 118. Thereafter, further withdrawal of the sled 104 does not further withdraw the push rod body 118.

Figure 6:
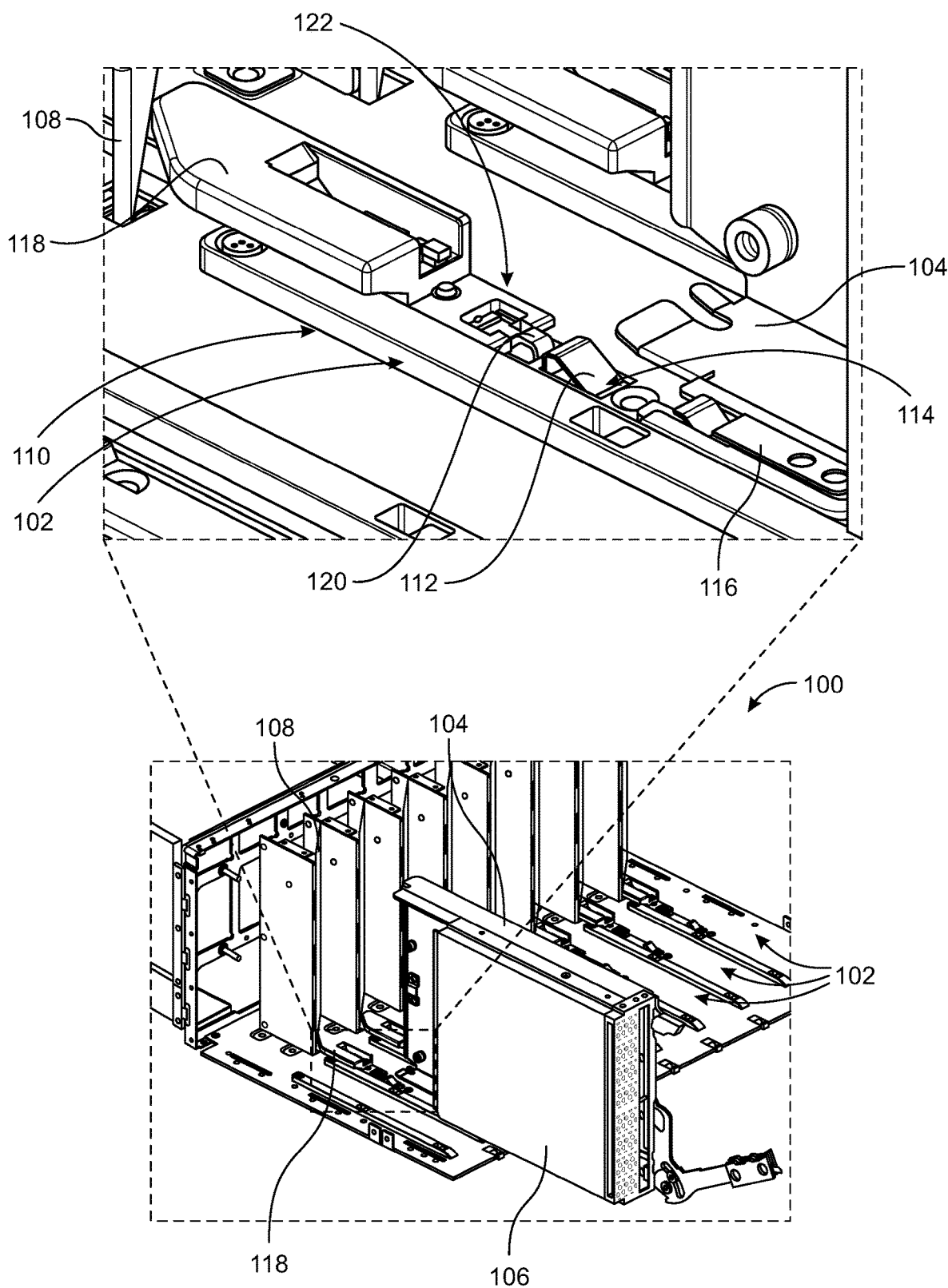
FIG. 6 is a perspective view depicting another step of withdrawing a sled from a slot of a chassis, according to aspects of the present disclosure.

Referring to FIG. 6, with the sled latch 116 disengaged from the cutout 122 of the push rod body 118, the sled 104 can be entirely removed from the slot 102. With the sled 104 removed, the chassis latch 112 returns to its normal position extending through the aperture 114 in the chassis 100 (or at least the panel of the chassis 100 that partially defines the slot 102), as shown in the detailed portion.

Referring to FIGS. 7A and 7B, illustrated are further components of the lock mechanism 110 discussed above, according to aspects of the present disclosure. The lock mechanism 110 includes a gear rack body 702 and a gear wheel 704. The gear rack body 702 is configured to translate forward and backward in the direction of the slot 102. The gear rack body 702 includes a gear rack projection 706 that abuts a corresponding push rod latch projection 708 on a push rod latch 718 (FIG. 7B), which is below the push rod body 118. The push rod latch projection 708 is configured to be on a trailing edge of the gear rack projection 706 so that the push rod body 118 can translate towards the flap without the gear rack projection 706 abutting the push rod latch projection 708. The gear rack projection 706 is positioned near the leading end 702a of the gear rack body 702 on a side edge 702b. The position of the gear rack projection 706 on the gear rack body 702 provides the correct timing of the elements of the lock mechanism 110 upon withdrawal of the sled 104 to lock the flap 108. Referring to FIG. 7B, the gear rack body 702 further includes gear teeth 712 that interface with gear teeth 714 of the gear wheel 704. Translation of the gear rack body 702 within the slot 102 (FIG. 7A) causes the gear wheel 704 to rotate about a center of rotation represented by the dashed line 716.

Figure 17:
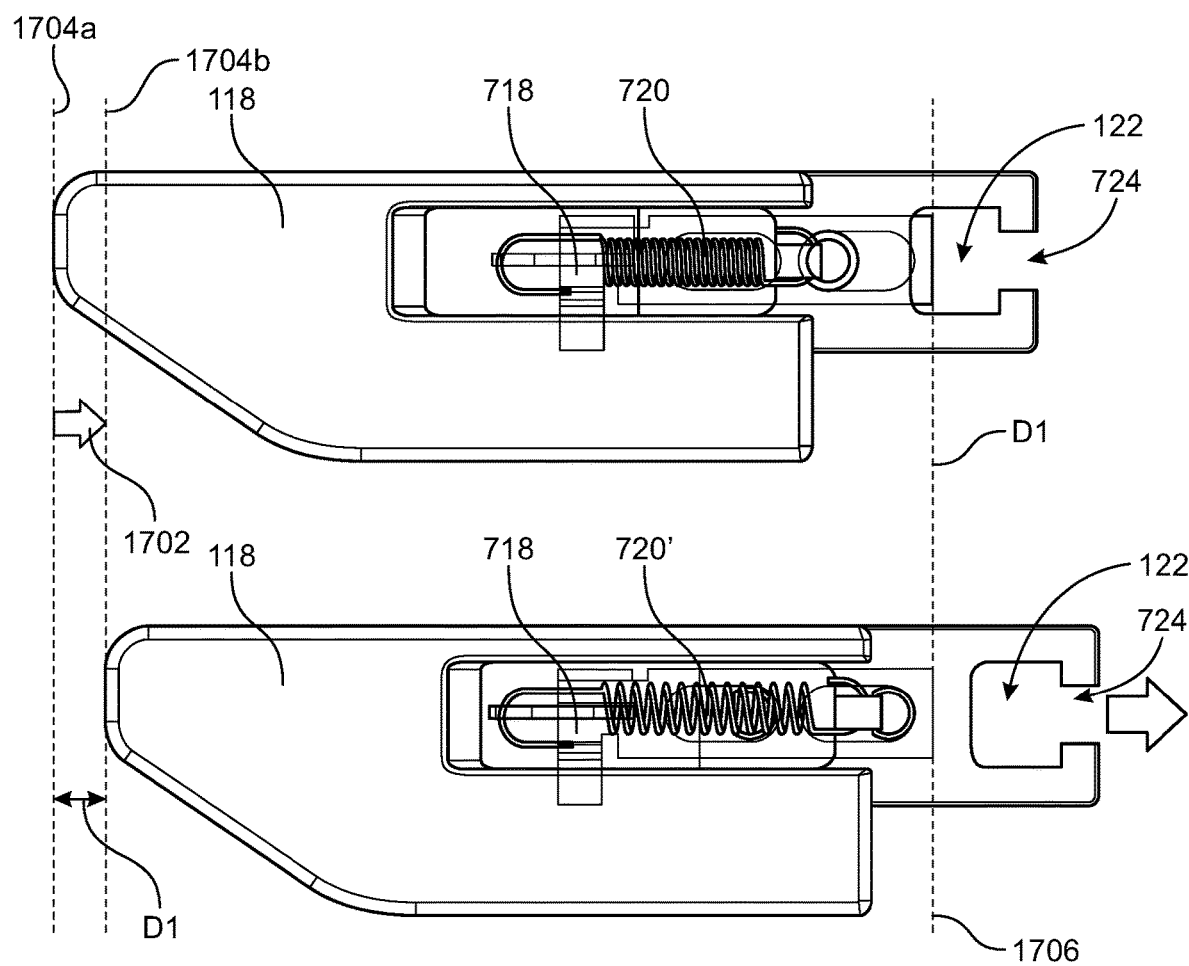
FIG. 17 is a top view of a push rod body translating relative to a push rod latch, according to aspects of the present disclosure.

Referring back to FIG. 7A, the gear wheel 704 is coupled to the flap 108. Thus, rotation of the gear wheel 704 causes the flap 108 to rotate in the same direction. Further, the push rod body 118 includes a notch 724 at the leading edge 118a of the push rod body 118. The notch 724 allows the leading edge 118a of the push rod body 118 to extend beyond chassis projection 120 (shown translucent) so that the chassis projection 120 can act on the sled latch 116 (not shown) for disengaging the sled latch 116 from the cutout 122, as discussed above (FIG. 5) and below (FIG. 17).

Figure 8:
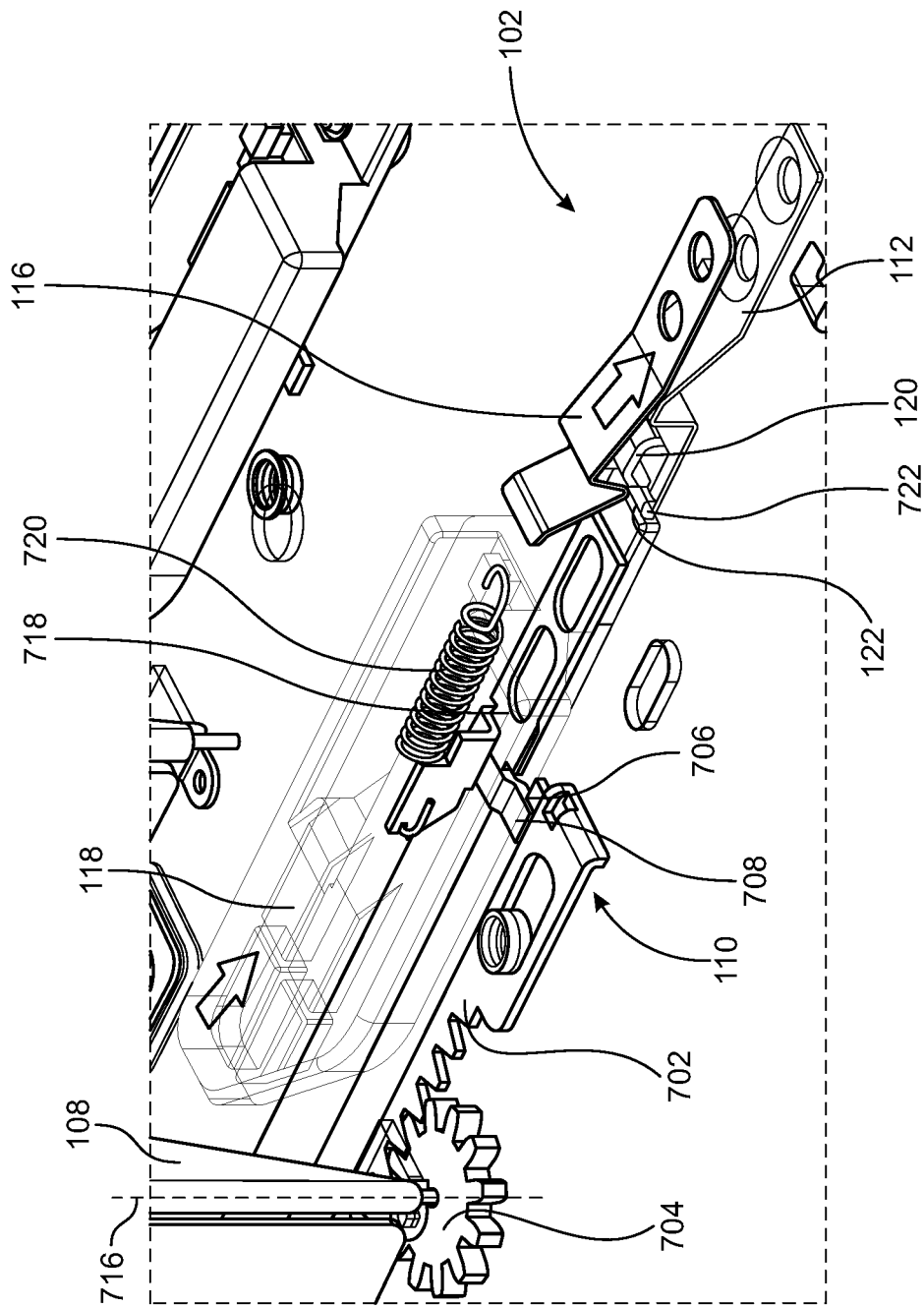
FIG. 8 is a top perspective view depicting a lock mechanism with an associated push rod body shown translucent for revealing additional elements, according to aspects of the present disclosure.

FIG. 8 is a similar view as FIG. 7A but with the push rod body 118 shown translucent to reveal additional features of the lock mechanism 110, according to aspects of the present disclosure. As disused above, below the push rod body 118 is the push rod latch 718. The push rod latch 718 includes the push rod latch projection 708 that abuts the gear rack projection 706 of the gear rack body 702. The push rod latch 718 is connected to one end of a spring 720. The other end of the spring 720 is connected to the push rod body 118.

As the sled 104 (FIGS. 1-6) is withdrawn from the slot 102, and before the sled latch 116 (FIGS. 1-6) disengages from the cutout 122 of the push rod body 118, the sled latch 116 continues to withdraw the push rod body 118. Yet, the push rod latch 718 is prevented from being withdrawn farther because the push rod latch projection 708 abuts the gear rack projection 706 of the gear rack body 702, and because the gear rack body 702 cannot translate farther in the direction of the withdrawing sled 104 based on the gear rack body 702 being engaged with the gear wheel 704. This causes tension in the spring 720 as the push rod body 118 continues to translate farther with the withdrawing sled latch 116. Once the sled 104 and sled latch 116 are withdrawn farther in the slot 102, the sled latch 116 rides over the projection 120, which causes the sled latch 116 to release from the push rod body 118.

As the sled 104 is withdrawn farther from the slot 102, the sled 104 no longer depresses the chassis latch 112, which allows the chassis latch 112 to return to an at-rest position, such as that shown in FIG. 1. The chassis latch 112 includes at least one tooth 722 that engages the cutout 122 of the push rod body 118. The tooth 722 can also be seen in FIG. 7B, discussed above. The at least one tooth 722 engaging the cutout 122 locks the push rod body 118 from translating in the slot 102. The flap 108 is locked in the closed position when the chassis latch 112 is engaged with the cutout 122 of the push rod body 118, with the flap 108 in the closed position and the push rod latch projection 708 abutting against the gear rack projection 706 to prevent the gear wheel 704, through the gear rack body 702, from rotating. Thus, this arrangement prevents the flap 108 from opening in response to an air pressure differential on opposite sides of the flap 108.

Figure 9:
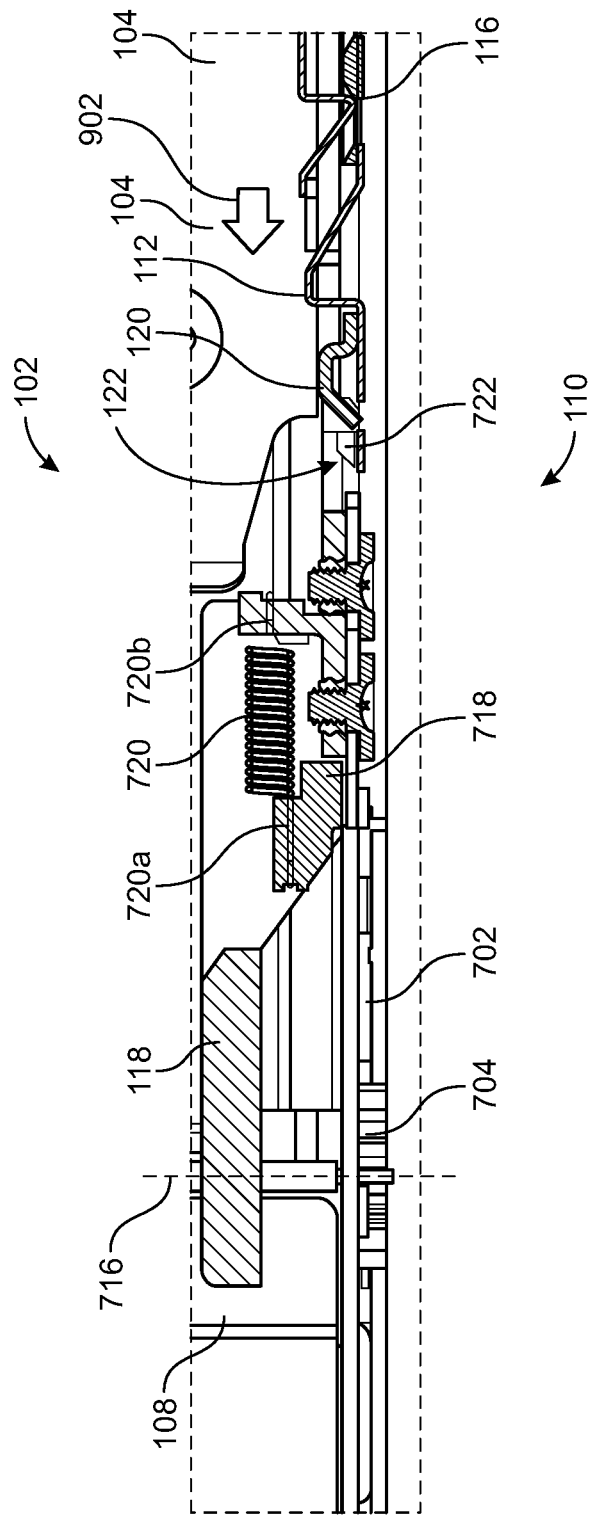
FIG. 9 is a cross-sectional view depicting a step of inserting a sled into a slot of a chassis, according to aspects of the present disclosure.

FIGS. 9-16 illustrate additional views of the sled 104 being inserted into and withdrawn from the slot 102, along with operation of the lock mechanism 110, according to aspects of the present disclosure. Referring to FIG. 9, the sled 104 is shown being inserted into the slot 102 in the direction of the arrow 902. As described above, prior to the sled latch 116 contacting the chassis latch 112, the at least one tooth 722 is engaged with the cutout 122 of the push rod body 118. The spring 720 is also connected at one end 720a to the push rod body 118, and at the other end 720b to the push rod latch 718. However, in this position, the spring 720 is not under tension or may be under minimal tension. The gear rack body 702 is in a locked position (or an at-rest position) and engaged with the push rod body 118 via engagement between the gear rack projection 706 and the push rod latch projection 708, both not shown. The gear wheel 704 is also in a rotational position about the axis of rotation 716 corresponding to the flap 108 (not shown) in a closed position within the slot 102.

Figure 10:
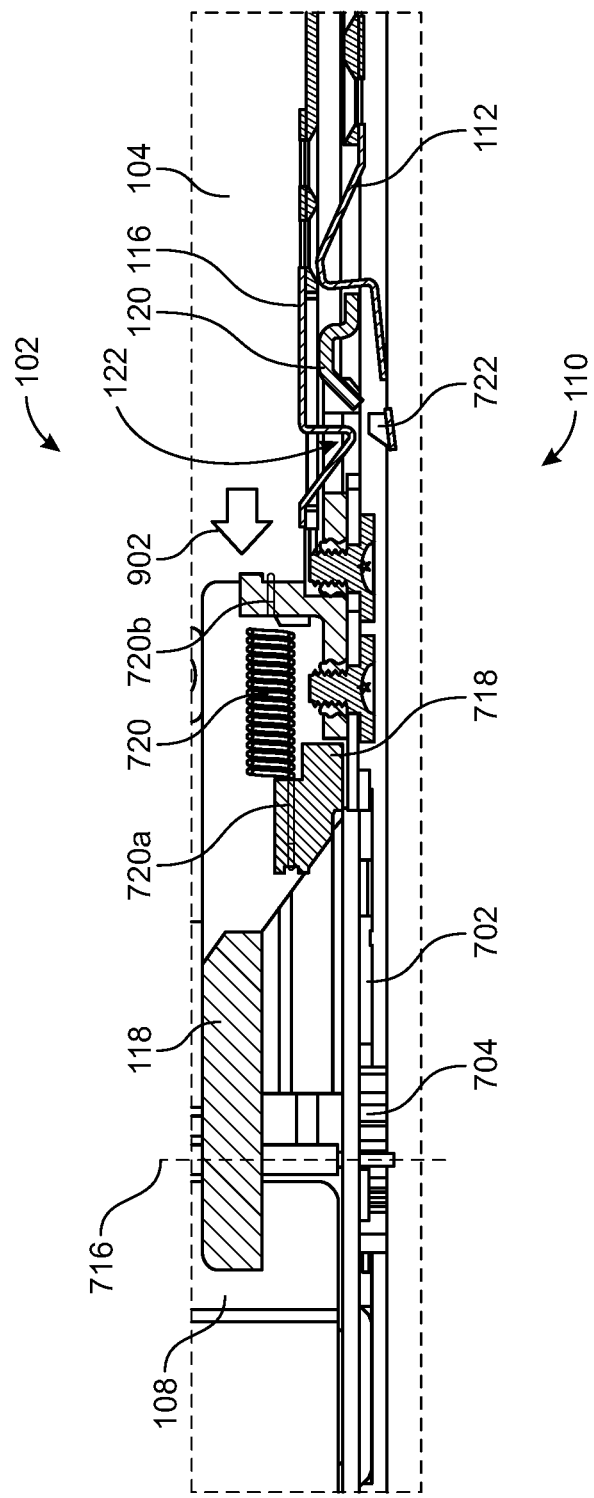
FIG. 10 is a cross-sectional view depicting another step of inserting a sled into a slot of a chassis, according to aspects of the present disclosure.

Referring to FIG. 10, as the sled 104 is further inserted into the slot 102 in the direction of the arrow 902, the sled 104 overrides the chassis latch 112, which causes the chassis latch 112 to be pressed down and the at least one tooth 722 to disengage from the cutout 122 in the push rod body 118. After the sled latch 116 rides over the projection 120, the sled latch 116 drops down into and engages with the push rod body 118 in the cutout 122. Engagement with the sled latch 116, contact with the sled 104, or both causes the push rod body 118 to move in the direction of the arrow 902 as the sled 104 is further inserted into the slot 102.

Figure 11:
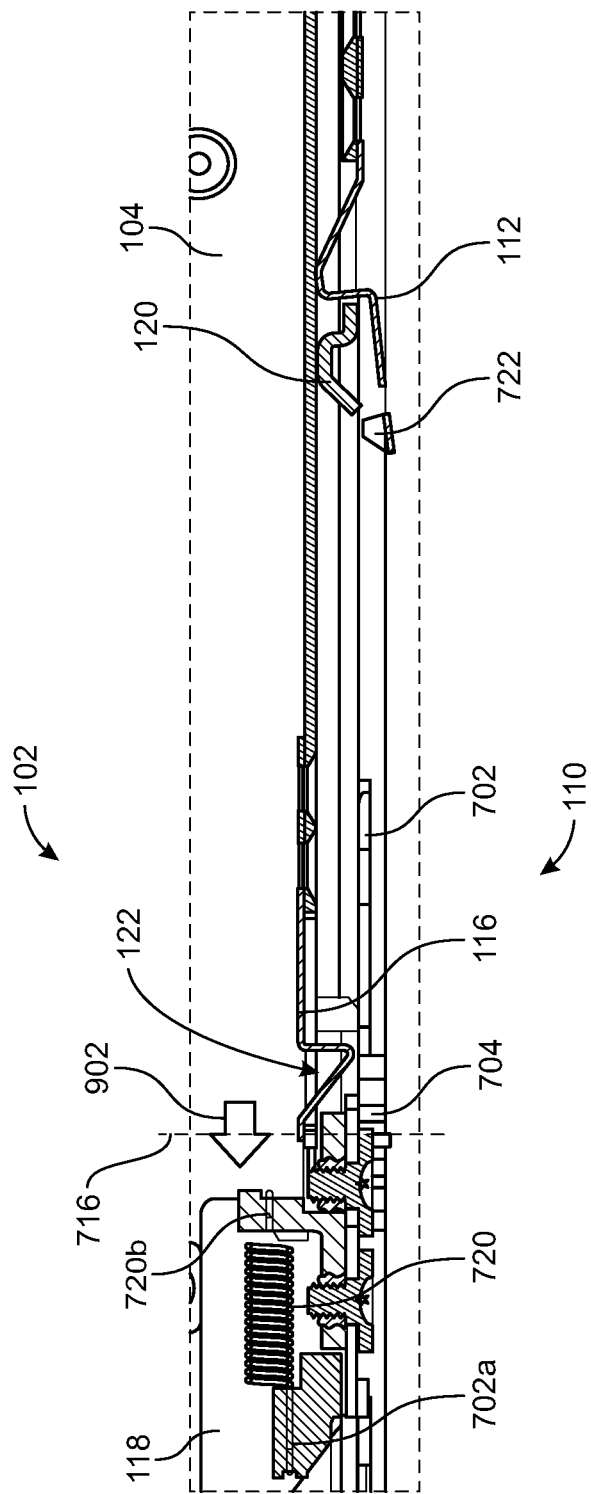
FIG. 11 is a cross-sectional view depicting another step of inserting a sled into a slot of a chassis, according to aspects of the present disclosure.
Figure 12:
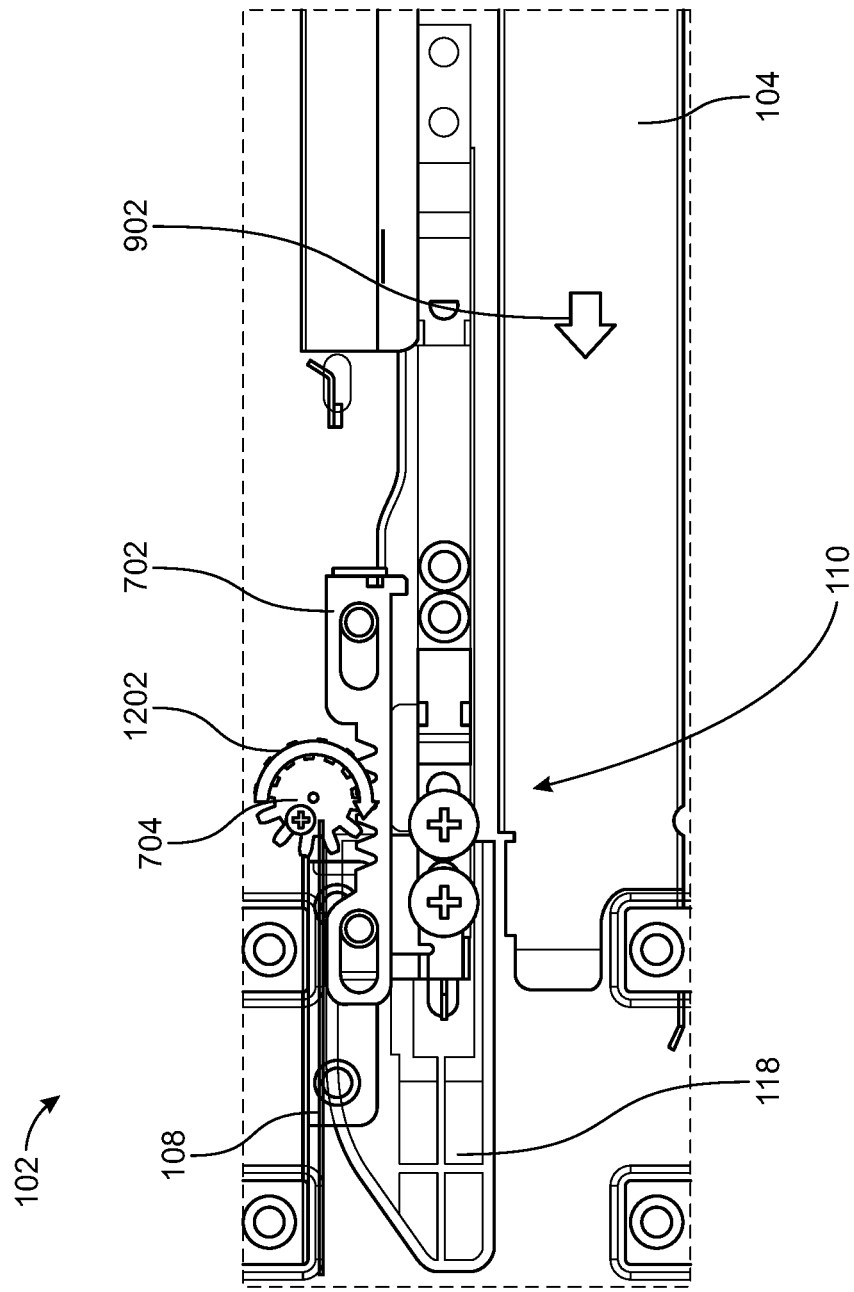
FIG. 12 is a top view depicting another step of inserting a sled into a slot of a chassis, according to aspects of the present disclosure.

Referring to FIGS. 11 and 12, as the sled 104 is further inserted into the slot 102 in the direction of arrow 902, the push rod body 118 extends beyond the gear wheel 704 (FIG. 11) and causes the flap 108 to fully open (FIG. 12). The gear wheel 704 rotates in the direction of arrow 1202 (FIG. 12) as the flap 108 opens. Further, with the sled 104 fully inserted into the slot 102, the push rod body 118 maintains the flap 108 fully open (FIG. 12).

Figure 13:
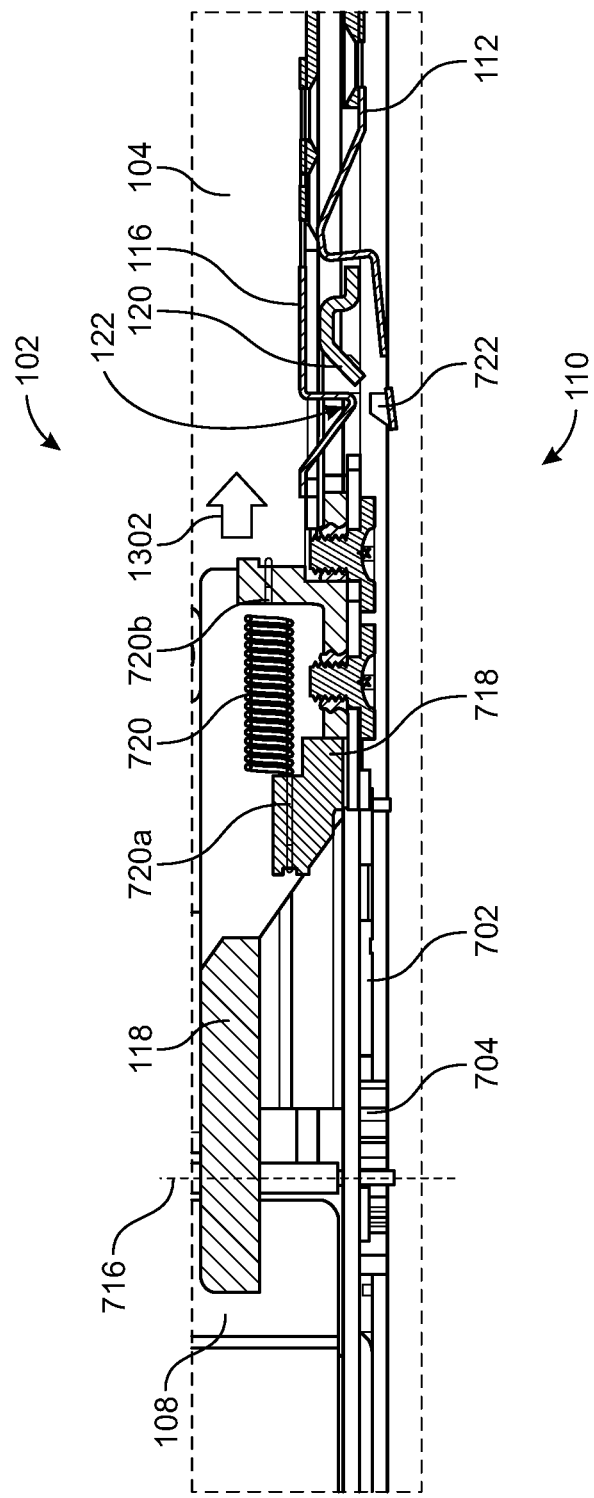
FIG. 13 is a cross-sectional view depicting a step of withdrawing a sled from a slot of a chassis, according to aspects of the present disclosure.

Referring to FIG. 13, as the sled 104 is withdrawn from the slot 102 in the direction of the arrow 1302, the sled latch 116 engaged with the cutout 122 of the push rod body 118 causes the push rod body 118 to be withdrawn away from the flap 108 in the same direction as the arrow 1302. This allows the flap 108 to actuate back to a closed position (not illustrated).

Figure 14:
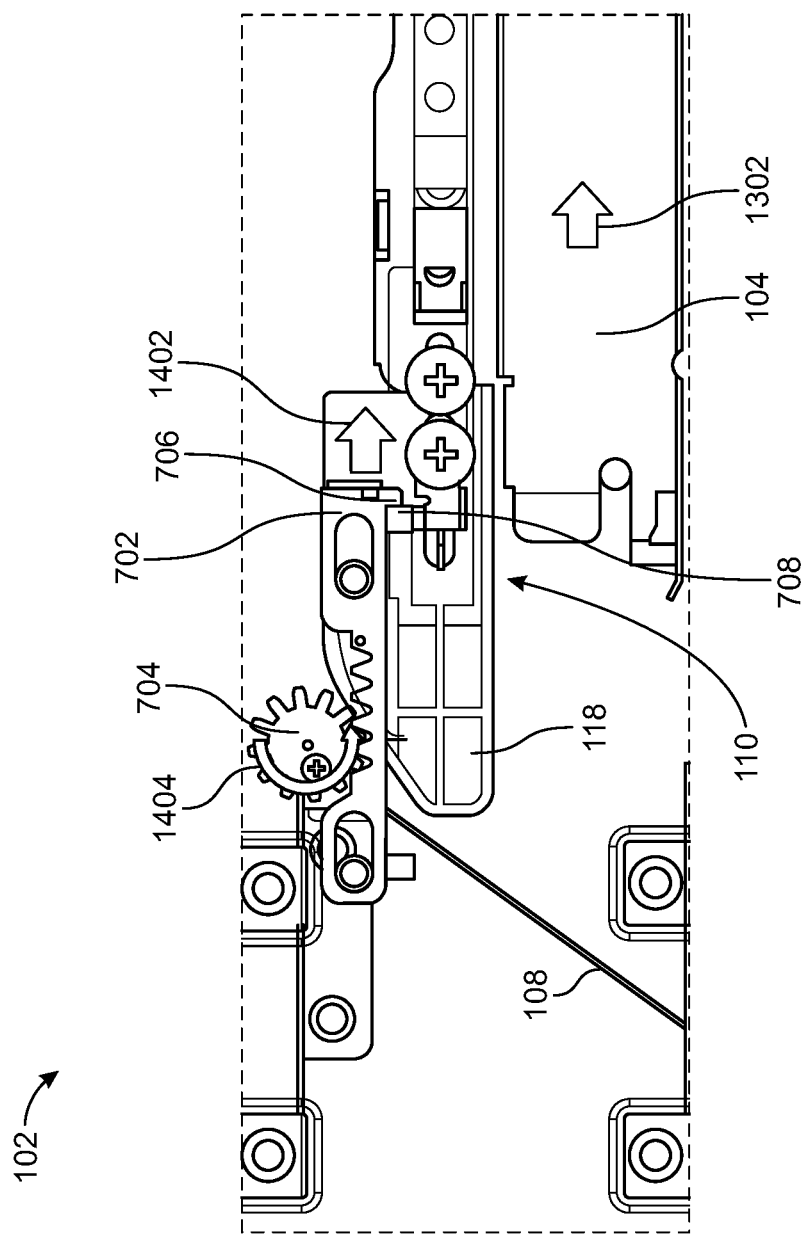
FIG. 14 is a top view depicting another step of withdrawing a sled from a slot of a chassis, according to aspects of the present disclosure.

Referring to FIG. 14, as the sled 104 is further withdrawn from the slot 102 in the direction of the arrow 1302, the projection 708 on the push rod latch (not shown) abuts against the projection 706 on the gear rack body 702. This causes the gear rack body 702 to translate in the direction of the arrow 1402, which causes the gear wheel 704 to rotate in the direction of arrow 1404.

Figure 15:
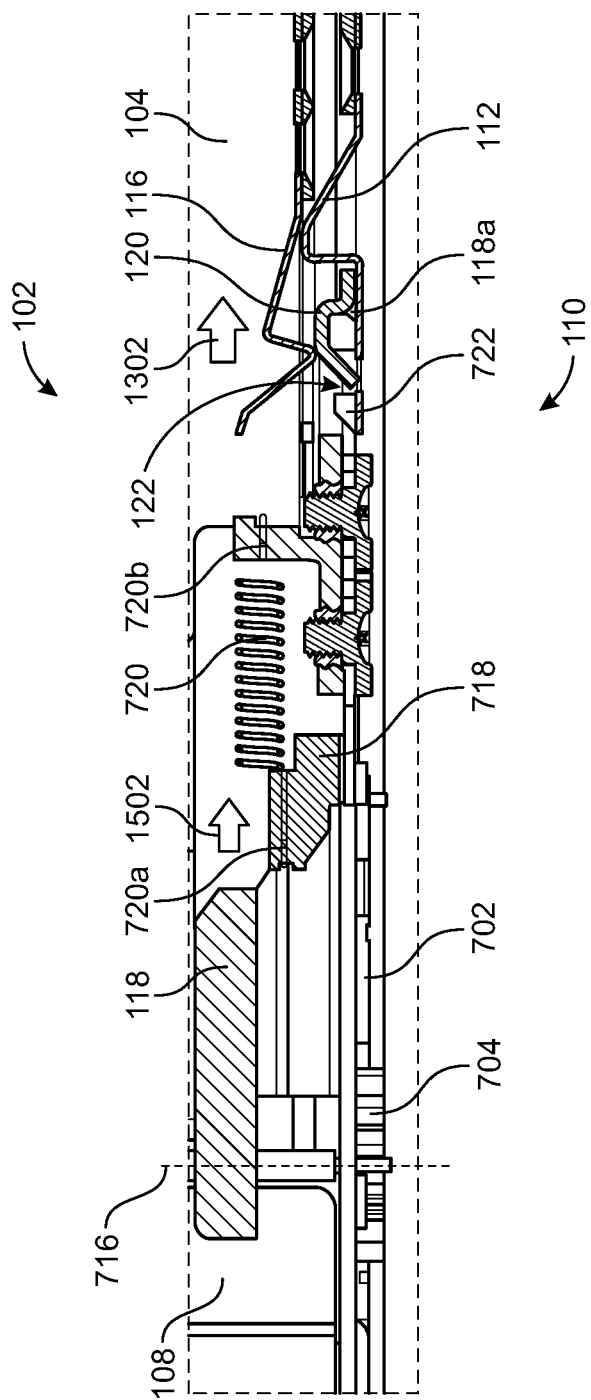
FIG. 15 is a cross-sectional view depicting another step of withdrawing a sled from a slot of a chassis, according to aspects of the present disclosure.

Referring to FIG. 15, as the sled 104 is further removed from the slot 102 in the direction of the arrow 1302, the sled latch 116 withdraws the leading edge 118a of the push rod body 118 beyond the chassis projection 120. Thereafter, and as shown in FIG. 15, the sled latch 116 overrides the projection 120. Overriding the projection 120 causes the sled latch 116 to rise up and disengage from the cutout 122 of the push rod body 118, which causes the sled latch 116 to release the push rod body 118. The sled 104 being withdrawn also removes the sled 104 from depressing the chassis latch 112, which allows the at least one tooth 722 of the chassis latch to re-engage the cutout 122 of the push rod body 118. Just prior to, and immediately after, the sled latch 116 releasing the push rod body 118, the spring 720 is tensioned in the direction of arrow 1502.

Figure 16:
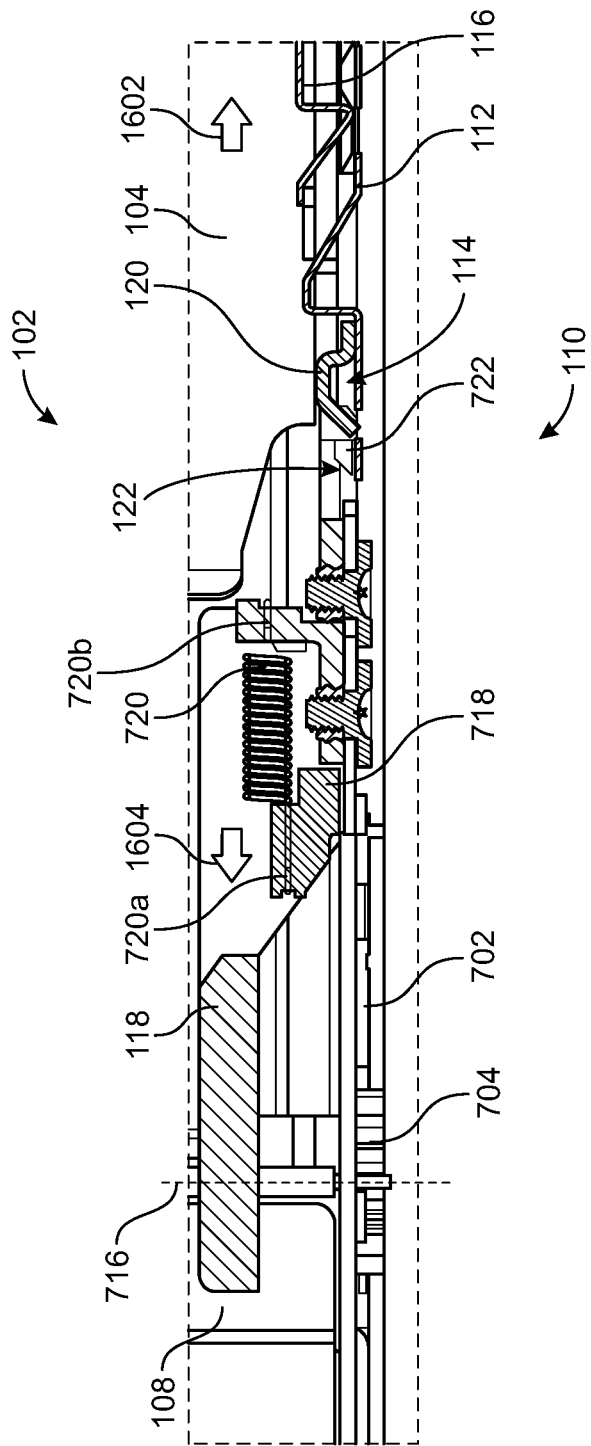
FIG. 16 is a cross-sectional view depicting another step of withdrawing a sled from a slot of a chassis, according to aspects of the present disclosure.

Referring to FIG. 16, with the sled latch 116 disengaged from the cutout 122 of the push rod body 118, the sled 104 can be fully removed from the slot 102 in the direction of arrow 1602. The chassis latch 112 is also in its normal or at-rest position extending through the aperture 114 in the chassis 100, or at least the panel of the chassis 100 that partially defines the slot 102. After being released from the sled latch 116, the push rod body 118 translates in the direction of the arrow 1604 in response to the spring 720 releasing the built-up tension. Translation of the push rod body 118 causes the push rod body 118 to abut against the at least tooth 722.

In the arrangement of FIG. 16, the gear wheel 704, the gear rack body 702, the push rod latch 718, the push rod body 118, and the chassis latch 112 cooperate to restrict the flap 108 from opening with the flap 108 in the closed position, and the chassis latch 112 is engaged with the cutout 122 via the tooth 722. Thus, the flap 108 is closed and locked by the lock mechanism 110. More specifically, the flap 108 in the closed position is connected to the gear wheel 704. The gear wheel 704 is restricted from rotating to open the flap 108 by being engaged with the gear rack body 702. The gear rack body 702 is restricted from translating for opening the flap based on the abutting projections 706 and 708 (FIG. 14). The push rod latch 718 is restricted from translating based on its engagement with the push rod body 118, either directly (e.g., directly abutting) or through the spring 720. The push rod body 118 is restricted from translating by being engaged with the chassis latch 112, which his fixed to the slot 102 and unable to translate.

Referring to FIG. 17, illustrated is the above-described translation of the push rod body 118 relative to the push rod latch 718, according to aspects of the present disclosure. As the push rod body 118 is withdrawn away from the flap (not shown) through action of the sled latch (not shown) engaged with the cutout 122, the push rod body 118 translates from the top illustration in FIG. 17 to the bottom illustration in FIG. 17. The push rod body 118 translates in the direction of arrow 1702 and the distance D1 between the dashed lines 1704a and 1704b relative to the push rod latch 718. However, the push rod latch 718 is stationary, as represented by the solid line 1706, based on the abutting projections 706 and 708 described above (not shown). The translation of the push rod body 118 relative to the push rod latch 718 causes tension in the spring 720, as represented by the stretched spring 720' in the bottom portion of FIG. 17.

Upon the sled latch (not shown) releasing the push rod body 118 at the cutout 122, as described above, the tension in the spring 720' causes the push rod body 118 to return to the locked or at-rest position relative to the push rod latch 718, which results in the locking described above.

Thus, the push rod body 118 is configured to be able to translate in the direction of arrow 1702 relative to the push rod latch 718 to allow the chassis latch (not shown) to engage the cutout 122 of the push rod body 118 upon the sled (not shown) being withdrawn. However, the push rod body 118 and the push rod latch 718 can be configured to not allow the push rod body 118 to translate in an opposite direction of arrow 1702 beyond the untranslated state shown at the top of FIG. 17. In other words, to the left of dashed line 1704a, the push rod body 118 and the push rod latch 718 are configured to translate together in the direction opposite arrow 1702. This allows the push rod body 118 to translate the push rod latch 718 as the push rod body 118 translates in the slot (not shown) in an opposite direction as the arrow 1702, such as when a sled (not shown) is being inserted into the slot. The spring 720 and/or the push rod body 118 abutting the push rod latch 718 can prevent this translation. Thus, the push rod body 118 is configured to translate relative to the push rod latch 718 in the direction of arrow 1702 and translate with the push rod latch 718 in a direction opposite of arrow 1702.

While various embodiments of the present invention have been described above, it should be understood that they have been presented by way of example only, and not limitation. Numerous changes to the disclosed embodiments can be made in accordance with the disclosure herein without departing from the spirit or scope. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations, and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

The terminology used herein is for the purpose of describing particular embodiments only and is not intended to be limiting. As used herein, the singular forms "a," "an," and "the" are intended to include the plural forms as well, unless the context clearly indicates otherwise. Furthermore, to the extent that the terms "including," "includes," "having," "has," "with," or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. Furthermore, terms, such as those defined in commonly used dictionaries, should be interpreted as having a meaning that is consistent with their meaning in the context of the relevant art and will not be interpreted in an idealized or overly formal sense unless expressly so defined herein.

What is claimed is:

1. A lock mechanism within a slot of a computer chassis comprising: a gear wheel coupled to a flap within the slot, the flap being configured to restrict airflow through the slot; a gear rack body meshed with the gear wheel and configured to translate within the slot, the gear rack body having a gear rack projection; a push rod latch configured to translate within the slot, the push rod latch including a push rod latch projection aligned to abut against the gear rack projection; a push rod body configured to translate within the slot and abut against the flap for rotating the flap between an open position and a closed position, the push rod body including a cutout at a first end; and a chassis latch configured to engage the cutout of the push rod body when a sled is not depressing the chassis latch, wherein the gear wheel, the gear rack body, the push rod latch, the push rod body, and the chassis latch cooperate to restrict the flap from opening when the flap is in the closed position and the chassis latch is engaged with the cutout.

2. The lock mechanism of claim 1, further comprising:
   a spring connected to the push rod latch and the push rod body.

3. The lock mechanism of claim 2, wherein a first end of the spring is connected to the push rod body and a second end of the spring is connected to the push rod latch.

4. The lock mechanism of claim 1, wherein the push rod body rides partially on the push rod latch, with the push rod latch partially inserted into the push rod body.

5. The lock mechanism of claim 4, wherein the push rod body is configured to translate relative to the push rod latch in a first direction and translate with the push rod latch in a second direction.

6. The lock mechanism of claim 1, wherein the gear rack projection is positioned on a side edge near a leading end of the gear rack body.

7. The lock mechanism of claim 1, wherein the chassis latch is configured to be depressed and disengage from the cutout, to release the push rod body for translating within the slot.

8. The lock mechanism of claim 7, wherein the chassis latch includes at least one tooth that engages the cutout.

9. The lock mechanism of claim 1, wherein the gear wheel and the flap share a common axis of rotation.

10. The lock mechanism of claim 1, wherein the push rod body includes a notch in a leading edge.

11. A computer system comprising: a sled configured to retain a computer component; a chassis having a slot configured to accept the sled as the sled translates into the chassis; a flap configured to restrict airflow through the slot in a closed position and allow airflow through the slot in an open position; and a lock mechanism in the slot comprising: a gear wheel coupled to the flap; a gear rack body meshed with the gear wheel and configured to translate within the slot, the gear rack body having a gear rack projection; a push rod latch configured to translate within the slot, the push rod latch including a push rod latch projection aligned to abut against the gear rack projection; a push rod body configured to translate within the slot and abut against the flap for rotating the flap between the closed position and the open position, the push rod body including a cutout at a first end; and a chassis latch configured to engage the cutout of the push rod body when the sled is not depressing the chassis latch, wherein the chassis latch is engaged with the cutout with the flap in the closed position and the push rod latch projection abuts against the gear rack projection to prevent the gear wheel, through the gear rack body, from rotating, which locks the flap in the closed position.

12. The computer system of claim 11, further comprising:
a spring connected to the push rod latch and the push rod body.

13. The computer system of claim 12, wherein a first end of the spring is connected to the push rod body and a second end of the spring is connected to the push rod latch.

14. The computer system of claim 12, wherein, with the flap in the closed position, tension builds in the spring as the push rod body further translates towards a leading end of the slot under action of the sled latch in response to the sled being withdrawn from the slot.

15. The computer system of claim 14, wherein the tension in the spring is configured to return the push rod body to a locked position upon the sled latch disengaging from the cutout of the push rod body, with the fan in the closed position.

16. The computer system of claim 15, wherein the push rod body is configured to translate relative to the push rod latch in a first direction and translate with the push rod latch in a second direction.

17. The computer system of claim 11, wherein the sled body is configured to depress the chassis latch when the sled body is inserted into the slot, which disengages the chassis latch from the cutout of the push rod body.

18. The computer system of claim 11, wherein the sled comprises:
a sled latch connected to the sled body and configured to engage the cutout of the push rod body and withdraw the push rod body from actuating the flap open upon removal of the sled from the slot.

19. The computer system of claim 18, further comprising:
a chassis projection on the chassis configured to cause the sled latch to engage and disengage from the cutout of the push rod body as the sled latch rides over the chassis projection when the sled is inserted and withdrawn from the slot, respectively.

20. The computer system of claim 19, wherein the cutout of the push rod body includes a notch that allows a leading edge of the push rod body to translate beyond the chassis projection.

* * * * *